(12) United States Patent
Zhang et al.

(10) Patent No.: US 10,985,228 B2
(45) Date of Patent: Apr. 20, 2021

(54) FLEXIBLE DISPLAY PANEL WITH REINFORCED INSULATING LAYER, METHOD OF MANUFACTURING FLEXIBLE DISPLAY PANEL, AND FLEXIBLE DISPLAY APPARATUS

(71) Applicant: BOE Technology Group Co., Ltd., Beijing (CN)

(72) Inventors: Feng Zhang, Beijing (CN); Wenqu Liu, Beijing (CN); Zhijun Lv, Beijing (CN); Liwen Dong, Beijing (CN); Shizheng Zhang, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/133,453

(22) Filed: Sep. 17, 2018

(65) Prior Publication Data
US 2019/0131368 A1     May 2, 2019

(30) Foreign Application Priority Data
Oct. 31, 2017    (CN) .......................... 201711045566.6

(51) Int. Cl.
*H01L 27/32*      (2006.01)
*H01L 51/00*      (2006.01)
(Continued)

(52) U.S. Cl.
CPC ...... *H01L 27/3258* (2013.01); *H01L 27/3262* (2013.01); *H01L 51/0097* (2013.01); *H01L 51/56* (2013.01); *H01L 27/124* (2013.01); *H01L 27/1218* (2013.01); *H01L 27/1248* (2013.01); *H01L 27/3246* (2013.01); *H01L 27/3248* (2013.01); *H01L 27/3276* (2013.01); *H01L 29/42384* (2013.01); *H01L 29/66757* (2013.01); *H01L 29/78675* (2013.01);
(Continued)

(58) Field of Classification Search
CPC ............ H01L 27/3258; H01L 27/3262; H01L 27/3248; H01L 27/3276; H01L 27/124; H01L 27/1218; H01L 27/1248; H01L 27/3246; H01L 27/3244; H01L 51/56; H01L 51/0097; H01L 51/5253; H01L 29/42384; H01L 29/78675; H01L 29/66757; H01L 2227/323
See application file for complete search history.

(56) References Cited

U.S. PATENT DOCUMENTS

2011/0303922 A1\* 12/2011 Cho .................... H01L 27/1288
                                                                              257/71
2015/0060778 A1\* 3/2015 Kim .................... H01L 27/3258
                                                                              257/40

\* cited by examiner

*Primary Examiner* — Laura M Menz
*Assistant Examiner* — Candice Chan
(74) *Attorney, Agent, or Firm* — McDermott Will & Emery LLP

(57) ABSTRACT

Embodiments of the present disclosure provide a flexible display panel, a method of manufacturing the flexible display panel, and a flexible display apparatus. The flexible display panel comprises: a reinforced insulating layer of an inorganic material, wherein the reinforced insulating layer comprises a reinforced region, and is formed with a reinforcing hole in the reinforced region; an organic material filled in the reinforcing hole; and at least one insulating film which is disposed on at least one of both sides of the reinforced insulating layer and which is in contact with the reinforced insulating layer at least in the reinforced region.

17 Claims, 3 Drawing Sheets

(51) Int. Cl.
*H01L 51/56* (2006.01)
*H01L 27/12* (2006.01)
*H01L 29/66* (2006.01)
*H01L 29/786* (2006.01)
*H01L 29/423* (2006.01)
*H01L 51/52* (2006.01)

(52) U.S. Cl.
CPC .... *H01L 51/5253* (2013.01); *H01L 2227/323* (2013.01); *H01L 2251/5338* (2013.01)

FLEXIBLE DISPLAY PANEL WITH REINFORCED INSULATING LAYER, METHOD OF MANUFACTURING FLEXIBLE DISPLAY PANEL, AND FLEXIBLE DISPLAY APPARATUS

CROSS-REFERENCE TO RELATED APPLICATION

This application claims priority to Chinese Patent Application No. 201711045566.6, filed on Oct. 31, 2017, entitled "FLEXIBLE DISPLAY PANEL, METHOD OF MANUFACTURING FLEXIBLE DISPLAY PANEL, AND FLEXIBLE DISPLAY APPARATUS", which is incorporated herein by reference.

TECHNICAL FIELD

Embodiments of the present disclosure relate to the field of display technology, and particularly to a flexible display panel, a method of manufacturing the flexible display panel, and a flexible display apparatus.

BACKGROUND

A flexible display apparatus comprises a flexible display panel. In the flexible display panel, an insulating layer of an inorganic material is formed to insulate conductive films located on both sides of the insulating layer from each other. For example, in a flexible AMOLED (Active Matrix Organic Light Emitting Diode) display panel, generally a gate insulating layer of a thin film transistor is an insulating layer of an inorganic material such as silicon oxide ($SiO_2$), silicon nitride ($SiN_x$), and silicon oxynitride (SiON), etc., for insulating a gate and an active layer of the thin film transistor from each other. However, when the flexible display apparatus is repeatedly bent, that is, when the flexible display panel is repeatedly bent, the insulating layer of the inorganic material is liable to be cracked or even broken due to stress, thereby causing phenomena such as a short circuit of the conductive films on both sides of the insulating layer of the inorganic material, and thus resulting in a decline in quality or even failure of the flexible display apparatus.

SUMMARY

Embodiments of the present disclosure provide a flexible display panel comprising: a reinforced insulating layer of an inorganic material, wherein the reinforced insulating layer comprises a reinforced region, and is formed with a reinforcing hole in the reinforced region; an organic material filled in the reinforcing hole; and at least one insulating film which is disposed on at least one of both sides of the reinforced insulating layer and which is in contact with the reinforced insulating layer at least in the reinforced region.

According to embodiments of the present disclosure, the reinforcing hole is a through hole or a blind hole.

According to embodiments of the present disclosure, two insulating films are respectively disposed on both sides of the reinforced insulating layer and are in contact with the reinforced insulating layer at least in the reinforced region.

According to embodiments of the present disclosure, the flexible display panel further comprises: a plurality of pixel regions arranged in an array and each having a pixel display area configured to emit a light of a pixel; and a thin film transistor comprising: a gate, an active layer, and a gate insulating layer between the gate and the active layer, wherein the gate insulating layer serves as the reinforced insulating layer, and is formed, in each pixel display area, with the reinforcing hole filled with the organic material.

According to embodiments of the present disclosure, the thin film transistor further comprises: a source-drain layer, and an interlayer insulating layer between the gate and the source-drain layer, and the interlayer insulating layer serves as the reinforced insulating layer, and is formed, in each pixel display area, with the reinforcing hole filled with the organic material.

According to embodiments of the present disclosure, the reinforcing hole of the gate insulating layer and the reinforcing hole of the interlayer insulating layer are aligned and communicated with each other.

According to embodiments of the present disclosure, the flexible display panel further comprises: an organic light-emitting diode; and an organic planarization layer disposed between the thin film transistor and the organic light-emitting diode and comprising a planarization portion and a filler portion filled in the reinforcing hole of the gate insulating layer and the reinforcing hole of the interlayer insulating layer.

According to embodiments of the present disclosure, the organic planarization layer is made of polyimide.

According to embodiments of the present disclosure, the flexible display panel further comprises: a flexible substrate; and a buffer layer of an inorganic material between the flexible substrate and the thin film transistor.

According to embodiments of the present disclosure, the reinforcing hole is a tapered hole.

According to embodiments of the present disclosure, the flexible display panel further comprises: a plurality of pixel regions arranged in an array and each having a pixel display area configured to emit a light of a pixel, wherein the reinforced insulating layer is formed with the reinforcing hole in each pixel display area.

According to embodiments of the present disclosure, the reinforced insulating layer is formed with one reinforcing hole in each pixel display area.

According to embodiments of the present disclosure, the flexible display panel further comprises: organic light-emitting diodes arranged in an array and each comprising a light emitting layer, wherein orthogonal projections of the reinforcing holes of the reinforced insulating layer on a plane parallel to the flexible display panel are positioned within orthogonal projections of the light emitting layers of the organic light-emitting diodes on the plane, respectively.

Embodiments of the present disclosure further provide a flexible display apparatus comprising the above flexible display panel.

Embodiments of the present disclosure further provide a method of manufacturing the above flexible display panel, comprising: forming the reinforced insulating layer from the inorganic material; forming the reinforcing hole in the reinforced insulating layer in the reinforced region; and filling the organic material in the reinforcing hole.

According to embodiments of the present disclosure, the method further comprises: prior to forming the reinforced insulating layer from the inorganic material, forming a first insulating film such that the first insulating film is in contact with the reinforced insulating layer at least in the reinforced region; and/or subsequent to filling the organic material in the reinforcing hole, forming a second insulating film such that the second insulating film is in contact with the reinforced insulating layer at least in the reinforced region.

According to embodiments of the present disclosure, the flexible display panel further comprises a plurality of pixel regions arranged in an array and each having a pixel display area configured to emit a light of a pixel, and the reinforced insulating layer is formed with the reinforcing hole in each pixel display area.

According to embodiments of the present disclosure, the reinforced insulating layer is formed with one reinforcing hole in each pixel display area.

According to embodiments of the present disclosure, the flexible display panel further comprises: a plurality of pixel regions arranged in an array and each having a pixel display area configured to emit a light of a pixel; and a thin film transistor comprising: a gate, a gate insulating layer, a source-drain layer, and an interlayer insulating layer located between the gate and the source-drain layer and overlapping the gate insulating layer in each pixel display area, forming the reinforcing hole in the reinforced insulating layer in the reinforced region comprises: forming, in each pixel display area, the reinforcing hole passing through the gate insulating layer and the reinforcing hole passing through the interlayer insulating layer; and filling the organic material in the reinforcing hole comprises: filling the organic material in the reinforcing hole of the gate insulating layer and the reinforcing hole of the interlayer insulating layer.

According to embodiments of the present disclosure, the method further comprises: while filling the organic material in the reinforcing hole of the gate insulating layer and the reinforcing hole of the interlayer insulating layer, forming a planarization layer of the organic material on the interlayer insulating layer such that the planarization layer comprises a planarization portion and a filler portion filled in the reinforcing hole of the gate insulating layer and the reinforcing hole of the interlayer insulating layer.

BRIEF DESCRIPTION OF THE DRAWINGS

The drawings described herein are used to provide further understanding of the present disclosure and constitute a part of the present disclosure. The present disclosure are explained by means of the drawings together with the following embodiments but should not be construed as being limited to the drawings and embodiments. In the accompanying drawings.

DETAILED DESCRIPTION

In order to further describe a flexible display panel, a method of manufacturing a flexible display panel, and a flexible display apparatus according to embodiments of the present disclosure, a further description of them will be made in detail as below with reference to the accompanying drawings.

Figure 1:
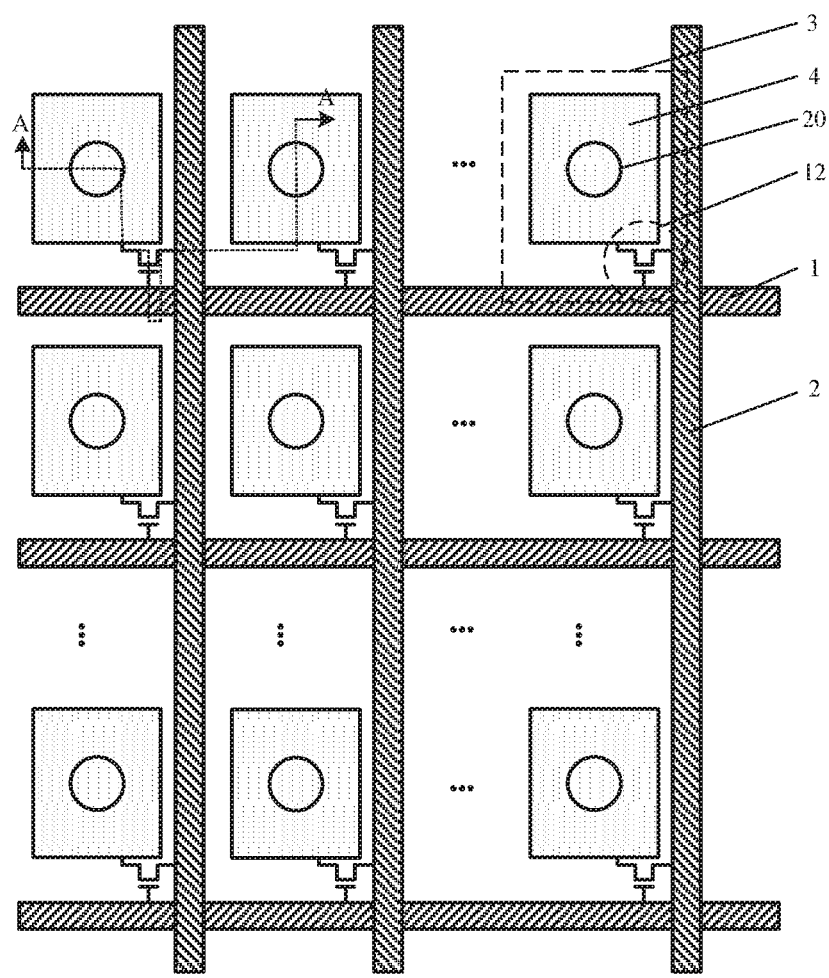
FIG. 1 is a schematic top view of a flexible display panel according to an embodiment of the present disclosure.
Figure 2:
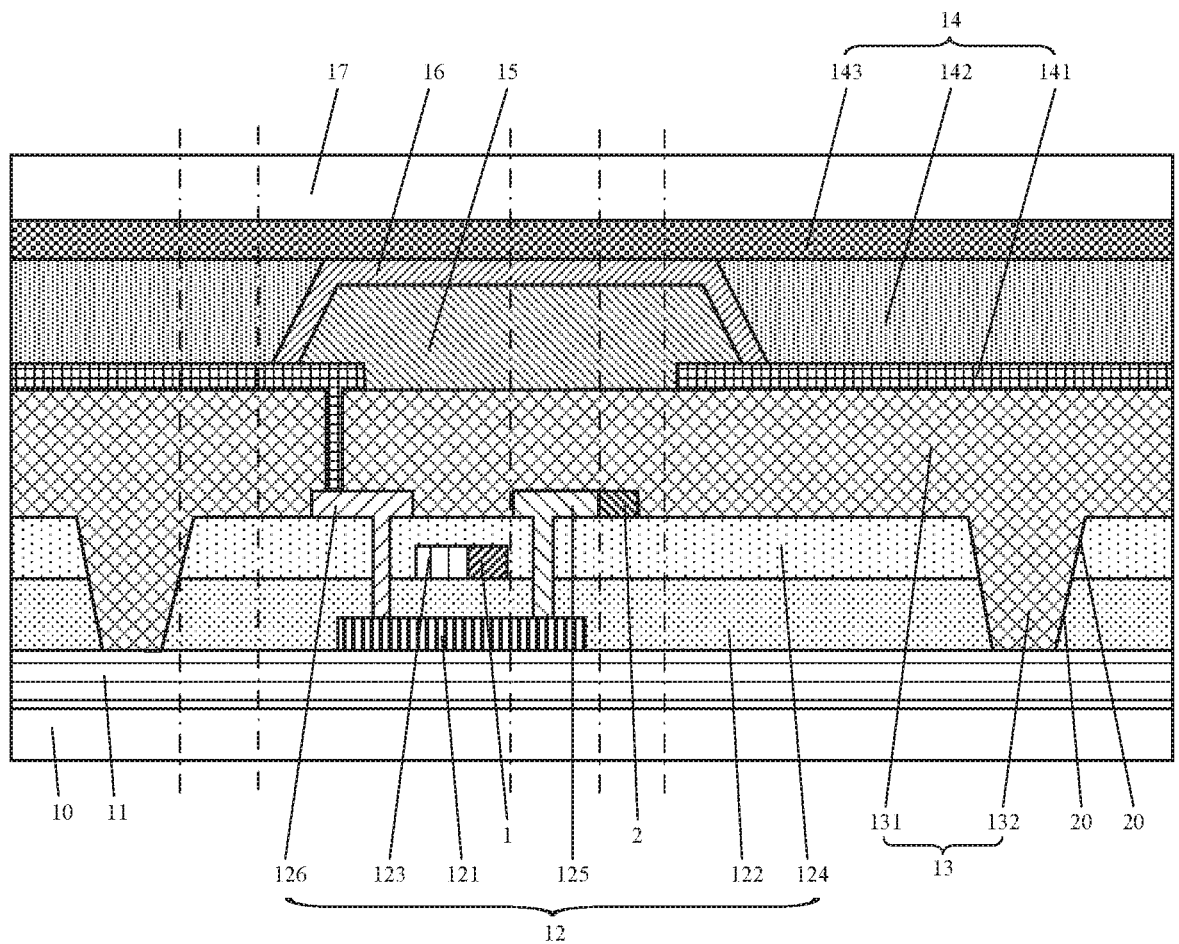
FIG. 2 is a schematic sectional view of the flexible display panel taken along the line A-A in FIG. 1.

Referring to FIG. 1 and FIG. 2, embodiments of the present disclosure provide a flexible display panel. The flexible display panel comprises: a reinforced insulating layer of an inorganic material, the reinforced insulating layer comprising a reinforced region, and being formed with a reinforcing hole 20 in the reinforced region; an organic material filled in the reinforcing hole 20; and at least one insulating film which is disposed on at least one of both sides of the reinforced insulating layer and which is in contact with the reinforced insulating layer at least in the reinforced region. The reinforcing hole 20 may be a tapered hole. For example, two insulating films are respectively disposed on both sides of the reinforced insulating layer and are in contact with the reinforced insulating layer at least in the reinforced region.

Referring to FIG. 1 and FIG. 2, in embodiments of the present disclosure, the flexible display panel further comprises: a plurality of pixel regions 3 arranged in an array and each having a pixel display area 4 configured to emit a light of a pixel; and a thin film transistor 12 comprising: a gate 123, an active layer 121, and a gate insulating layer 122 between the gate 123 and the active layer 121. The gate insulating layer 122 serves as the reinforced insulating layer, and is formed, in each pixel display area 4, with the reinforcing hole 20 filled with the organic material. The thin film transistor 12 may be a low-temperature polysilicon thin film transistor 12. The thin film transistor 12 further comprises: a source-drain layer, and an interlayer insulating layer 124 between the gate 123 and the source-drain layer, and the interlayer insulating layer 124 serves as the reinforced insulating layer, and is formed, in each pixel display area 4, with the reinforcing hole 20 filled with the organic material. For example, the reinforcing hole 20 of the gate insulating layer 122 and the reinforcing hole 20 of the interlayer insulating layer 124 are aligned and communicated with each other.

Referring to FIG. 1 and FIG. 2, in embodiments of the present disclosure, the flexible display panel further comprises: an organic light-emitting diode 14; and an organic planarization layer 13 disposed between the thin film transistor 12 and the organic light-emitting diode 14 and comprising a planarization portion 131 and a filler portion 132 filled in the reinforcing hole 20 of the gate insulating layer 122 and the reinforcing hole 20 of the interlayer insulating layer 124.

Referring to FIG. 1 and FIG. 2, in embodiments of the present disclosure, the flexible display panel further comprises: a flexible substrate 10; and a buffer layer 11 of an inorganic material between the flexible substrate 10 and the thin film transistor 12.

Referring to FIG. 1 and FIG. 2, in embodiments of the present disclosure, the flexible display panel further comprises: a plurality of pixel regions 3 arranged in an array and each having a pixel display area 4 configured to emit a light of a pixel; and the reinforced insulating layer is formed with the reinforcing hole 20 in each pixel display area 4. For example, the reinforced insulating layer is formed with one reinforcing hole 20 in each pixel display area 4.

Referring to FIG. 1 and FIG. 2, in embodiments of the present disclosure, the flexible display panel further comprises: organic light-emitting diodes 14 arranged in an array and each comprising a light emitting layer 142. Orthogonal projections of the reinforcing holes 20 of the reinforced insulating layer on a plane parallel to the flexible display panel are positioned within orthogonal projections of the light emitting layers 142 of the organic light-emitting diodes 14 on the plane, respectively.

For example, referring to FIG. 1 and FIG. 2, a flexible display panel according to an embodiment of the present disclosure comprises: a plurality of gate lines 1, a plurality of data lines 2, and a plurality of pixel regions 3 delimited by the plurality of gate lines 1 and the plurality of data lines 2 crossing each other. The plurality of pixel regions 3 are arranged in an array and each pixel region 3 comprises a pixel display area 4 configured to emit a light of a pixel and a pixel non-display area. A thin film transistor 12 and a display device are disposed in each of the plurality of pixel regions 3. The thin film transistor 12 is located in the pixel non-display area, while the display device is located in the pixel display area 4. In the thin film transistor 12, in the display device, and/or between the thin film transistor 12 and the display device, generally, an insulating layer of an inorganic material is formed between two conductive films to insulate the conductive films from each other. The insulating layer of the inorganic material may serve as a reinforced insulating layer. For example, a gate insulating layer 122 is formed between the gate 123 and the active layer 121 of the thin film transistor 12. The gate insulating layer 122 serves as a reinforced insulating layer to insulate the gate 123 and the active layer 121 from each other. The reinforced insulating layer has: a first region in which the reinforced insulating layer needs to perform an insulating function; and a second region serving as a reinforced region. In the first region, a conductive film that is in contact with the reinforced insulating layer in the first region is disposed on one side of the reinforced insulating layer, or two conductive films that are in contact with the reinforced insulating layer in the first region are disposed on both sides of the reinforced insulating layer, while in the second region serving as the reinforced region, the reinforced insulating layer does not need to perform an insulating function since no conductive films that are in contact with the reinforced insulating layer are disposed on both sides of the reinforced insulating layer. For example, the first region of the gate insulating layer 122 of the thin film transistor 12 is a region of the gate insulating layer 122 corresponding to a conductive film that is disposed on a side of the gate insulating layer 122 and in contact with the gate insulating layer 122, such as the active layer 121, the gate 123, the gate line 1 and the data line 2, while the reinforced region of the gate insulating layer 122 is a region of the gate insulating layer 122 corresponding to the pixel display area 4 since no conductive films in contact with the gate insulating layer 122 are disposed on both sides of the gate insulating layer 122 in the region of the gate insulating layer 122 corresponding to the pixel display area 4 and the gate insulating layer 122 does not need to perform an insulating function in the region of the gate insulating layer 122 corresponding to the pixel display area 4. For example, the reinforced region of the gate insulating layer 122 is the region of the gate insulating layer 122 corresponding to the pixel display area 4 since no conductive films in contact with the gate insulating layer 122 are disposed on both sides of a portion of the gate insulating layer 122 corresponding to the pixel display area 4. The reinforcing hole is formed in the reinforced insulating layer in the reinforced region, thereby removing a portion of the reinforced insulating layer corresponding to the reinforcing hole, and the reinforcing hole is filled with the organic material. An area covered by the reinforced insulating layer is reduced and the reinforcing hole is filled with the organic material without influence on the insulating function of the reinforced insulating layer, thereby increasing a bending resistance of the flexible display panel.

Therefore, in the flexible display panel according to the embodiments of the present disclosure, the reinforcing hole is formed in the reinforced insulating layer in the reinforced region, thereby removing at least a portion of the reinforced insulating layer in the reinforced region, and the reinforcing hole is filled with the organic material. Hence, an area covered by the reinforced insulating layer is reduced and the reinforcing hole of the reinforced insulating layer is filled with the organic material without influence on the insulating function of the reinforced insulating layer. The organic material has a better bending resistance. For example, as shown in Table 1, in the case where insulating layers are made of silicon oxide ($SiO_2$) and polyimide, respectively, the insulating layer of the polyimide has much less stresses in both a direction perpendicular to the insulating layer (i.e. the vertical direction in Table 1) and a direction parallel to the insulating layer (i.e. the horizontal direction in Table 1) than the insulating layer of the silicon oxide. The polyimide has a better bending resistance than the silicon oxide. Therefore, in the case where the flexible display panel is repeatedly bent, a probability of occurrence of a crack or even a break in the reinforced insulating layer is reduced, and phenomena such as a short circuit of the conductive films on both sides of the reinforced insulating layer is prevented, thereby avoiding a decline in quality or even failure of the flexible display apparatus.

TABLE 1

| Material | Thickness of Insulating Layer (Å) | Stress (Vertical Direction, Mpa) | Stress (Horizontal Direction, Mpa) |
| --- | --- | --- | --- |
| $SiO_2$ | 6000 | −281.8 | −280.7 |
| Polyimide | 105700 | −10.6 | −1.8 |

In the above embodiments, the reinforcing hole may not pass through the reinforced insulating layer or may also pass through the reinforced insulating layer. The reinforcing hole 20 may be a through hole or a blind hole. In the embodiment of the present disclosure, the reinforcing hole may pass through the reinforced insulating layer, thereby completely removing a portion of the reinforced insulating layer in a region corresponding to the reinforcing hole, and the reinforcing hole is filled with the organic material, so that a probability of occurrence of a crack or even a break in the reinforced insulating layer is reduced, and phenomena such as a short circuit of the conductive films on both sides of the reinforced insulating layer is prevented, thereby avoiding a decline in quality or even failure of the flexible display apparatus.

In the above embodiment, the reinforced insulating layer is formed, in the reinforced region, with the reinforcing hole for removing a portion of the reinforced insulating layer in the reinforced region. The number and cross-sectional shape of the reinforcing hole may be set according to actual requirements. For example, the number of the reinforcing hole in each pixel region 3 or each pixel display area 4 may be one, two, three or more. There is no limitation on the number of the reinforcing hole. The reinforcing hole may have various cross-sectional shapes. For example, the cross-sectional shape of the reinforcing hole may be a circular shape, an elliptic shape, a polygonal shape (such as a triangular shape and a quadrangular), an annular shape, and the like.

Referring to FIG. 1 and FIG. 2, a flexible display panel according to an embodiment of the present disclosure comprises a thin film transistor 12. The thin film transistor 12 comprises: a gate insulating layer 122 between a gate 123 and an active layer 121. The gate insulating layer 122 serves as the reinforced insulating layer, and is formed, in each pixel display area 4, with the reinforcing hole 20 filled with the organic material.

In the above embodiments, the thin film transistor 12 may be an amorphous silicon thin film transistor, a monocrystalline silicon thin film transistor (or crystalline silicon thin film transistor), a polysilicon thin film transistor, a metal oxide thin film transistor, or the like. A description will be made as below with reference to an example in which the thin film transistor 12 is a low-temperature polysilicon thin film transistor. Referring to FIG. 1 and FIG. 2, a flexible display panel according to an embodiment of the present disclosure comprises a thin film transistor 12. The thin film transistor 12 is a low-temperature polysilicon thin film transistor. The thin film transistor 12 further comprises: an interlayer insulating layer 124 (for example, an interlayer dielectric layer) between the gate 123 and a source-drain layer, and the interlayer insulating layer 124 serves as the reinforced insulating layer, and is formed, in each pixel display area 4, with the reinforcing hole 20 filled with the organic material.

Specifically, referring to FIG. 1 and FIG. 2, the thin film transistor 12 is a low-temperature polysilicon thin film transistor. The thin film transistor 12 comprises: an active layer 121, a gate insulating layer 122, a gate 123, an interlayer insulating layer 124, and a source-drain layer. The gate insulating layer 122 covers the active layer 121 and the pixel region 3. The gate insulating layer 122 may be made of silicon oxide, silicon nitride, silicon oxynitride, or the like. In other words, the gate insulating layer 122 is a reinforced insulating layer. The gate insulating layer 122 has a first region, and a second region serving as a reinforced region. A conductive film that is in contact with the gate insulating layer 122 is disposed on at least one side of the gate insulating layer 122 in the first region. The conductive film may comprise: the active layer 121 underneath the gate insulating layer 122; and the gate 123 and the gate line 1 which are located on the gate insulating layer 122. The gate insulating layer 122 is formed with the reinforcing hole 20 in the second region serving as the reinforced region. For example, the reinforced region of the gate insulating layer 122 is a region of the gate insulating layer 122 corresponding to the pixel display area 4. The gate insulating layer 122 is formed, in each pixel display area 4, with the reinforcing hole 20 filled with the organic material. The gate 123 is located on the gate insulating layer 122, and is opposite to the active layer 121. The flexible display panel further comprises gate lines 1 delimiting the pixel regions 3 and formed on the gate insulating layer 122. The gates 123 of the thin film transistors 12 are connected to the gate lines 1, respectively. The interlayer insulating layer 124 covers the gate lines 1, the gates 123 and the gate insulating layer 122. The interlayer insulating layer 124 may be made of silicon oxide, silicon nitride, silicon oxynitride, or the like. In other words, the interlayer insulating layer 124 is a reinforced insulating layer. The interlayer insulating layer 124 has a first region, and a second region serving as a reinforced region. A conductive film that is in contact with the interlayer insulating layer 124 is disposed on at least one side of the interlayer insulating layer 124 in the first region. The conductive film may comprise: the gate 123 and the gate line 1 which are located underneath the interlayer insulating layer 124; and a source 125, a drain 126 and a data line 2 which are located on the interlayer insulating layer 124. The interlayer insulating layer 124 is formed with the reinforcing hole 20 in the second region serving as the reinforced region. For example, the reinforced region of the interlayer insulating layer 124 is a region of the interlayer insulating layer 124 corresponding to the pixel display area 4. The interlayer insulating layer 124 is formed, in each pixel display area 4, with the reinforcing hole 20 filled with the organic material. The source-drain layer is located on the interlayer insulating layer 124. The source-drain layer comprises the source 125 and the drain 126. The source 125 is connected to the active layer 121 through a first connection via hole passing through the interlayer insulating layer 124 and the gate insulating layer 122, while the drain 126 is connected to the active layer 121 through a second connection via hole passing through the interlayer insulating layer 124 and the gate insulating layer 122. The flexible display panel further comprises data lines 2 delimiting the pixel regions 3 and formed on the interlayer insulating layer 124. The source 125 of the thin film transistors 12 are connected to the data lines 2, respectively.

In the embodiment, the reinforcing hole 20 of the gate insulating layer 122 is located in the reinforced region of the gate insulating layer 122, and the reinforcing hole 20 of the interlayer insulating layer 124 is located in the reinforced region of the interlayer insulating layer 124. In actual applications, it is possible that the reinforcing hole 20 of the gate insulating layer 122 does not completely correspond in position to the reinforcing hole 20 of the interlayer insulating layer 124. Therefore, the reinforcing hole 20 of the gate insulating layer 122 and the reinforcing hole 20 of the interlayer insulating layer 124 are not aligned and communicated with each other. In this case, the reinforcing hole 20 of the gate insulating layer 122 and the reinforcing hole 20 of the interlayer insulating layer 124 are formed separately. In the embodiments of the present disclosure, however, it is assumed that the reinforcing hole 20 of the gate insulating layer 122 and the reinforcing hole 20 of the interlayer insulating layer 124 are aligned and communicated with each other. For example, referring to FIG. 1 and FIG. 2, the reinforcing hole 20 of the gate insulating layer 122 is located in the region of the gate insulating layer 122 corresponding to the pixel display area 4 of the pixel region 3, while the reinforcing hole 20 of the interlayer insulating layer 124 is located in the region of the interlayer insulating layer 124 corresponding to the pixel display area 4 of the pixel region 3. In this case, the reinforcing hole 20 of the gate insulating layer 122 and the reinforcing hole 20 of the interlayer insulating layer 124 may be aligned and communicated with each other. In order to form the reinforcing hole 20 of the interlayer insulating layer 124 and the reinforcing hole 20 of the gate insulating layer 122, after the interlayer insulating layer 124 is formed, a through hole passing through the interlayer insulating layer 124 and the gate insulating layer 122 in the pixel display area 4 may be formed by a single patterning process. The through hole comprises the reinforcing hole 20 of the interlayer insulating layer 124 and the reinforcing hole 20 of the gate insulating layer 122. Thereby, the number of process steps and the number of masks for manufacturing the flexible display panel are reduced.

In the case where the reinforcing hole 20 of the gate insulating layer 122 and the reinforcing hole 20 of the interlayer insulating layer 124 are aligned and communicated with each other, the reinforcing hole 20 of the gate insulating layer 122 and the reinforcing hole 20 of the interlayer insulating layer 124 may be filled with the organic material separately or together. In the embodiment of the present disclosure, referring to FIG. 2, the flexible display panel further comprises an organic light-emitting diode 14. The display device may be the organic light-emitting diode 14. In this case, the flexible display panel is an active matrix organic light-emitting diode (AMOLED) flexible display panel. An organic planarization layer 13 is disposed between the thin film transistor 12 and the organic light-emitting diode 14. The organic planarization layer 13 comprises a planarization portion 131 and a filler portion 132 filled both in the reinforcing hole 20 of the gate insulating layer 122 and in the reinforcing hole 20 of the interlayer insulating layer 124. When the flexible display panel according to the embodiments of the present disclosure is manufactured, the organic planarization layer 13 is formed after the reinforcing hole 20 of the interlayer insulating layer 124 and the reinforcing hole 20 of the gate insulating layer 122 are formed. The organic planarization layer 13 comprises the planarization portion 131 and the filler portion 132 filled both in the reinforcing hole 20 of the gate insulating layer 122 and in the reinforcing hole 20 of the interlayer insulating layer 124. The filler portion 132 also serves as the organic material filled in the reinforcing hole 20 of the gate insulating layer 122 and the reinforcing hole 20 of the interlayer insulating layer 124. In other words, when the organic planarization layer 13 is formed, the planarization portion 131 performing a planarization function, and the filler portion 132 filled both in the reinforcing hole 20 of the gate insulating layer 122 and in the reinforcing hole 20 of the interlayer insulating layer 124 are formed simultaneously without needing to form an organic material filled in the reinforcing hole 20 of the gate insulating layer 122, an organic material filled in the reinforcing hole 20 of the interlayer insulating layer 124, and the planarization portion 131 performing the planarization function, respectively. Thereby, the number of process steps for manufacturing the flexible display panel is reduced.

In the embodiments, both the organic planarization layer 13 and the flexible substrate 10 may be made of polyimide. In other words, the organic planarization layer 13 is a planarization layer of the polyimide and the flexible substrate 10 is a flexible substrate of the polyimide. The polyimide has a good bending resistance. The polyimide is selected as a material of the organic planarization layer 13. In this case, the polyimide is also the organic material filled in the reinforcing hole 20 of the gate insulating layer 122 and the organic material filled in the reinforcing hole 20 of the interlayer insulating layer 124. Thereby, the bending resistance of the flexible display panel can be improved. The bending resistance of the flexible substrate 10 can be improved since the polyimide is selected as a material of the flexible substrate 10.

Referring to FIG. 2, in the flexible display panel according to the embodiments of the present disclosure, the flexible display panel comprises the flexible substrate 10. A buffer layer 11 of an inorganic material is disposed between the flexible substrate 10 and the thin film transistor 12. In this case, the thin film transistor 12 is formed on the buffer layer 11 of the inorganic material. The buffer layer 11 of the inorganic material is disposed to avoid an adverse influence of the polyimide as the material of the flexible substrate 10 on the active layer 121 while ensuring a stable property of thin film transistor 12 subsequently formed.

Referring to FIG. 2, the flexible display panel according to the embodiment of the present disclosure further comprises a pixel defining layer 15 and a spacer 16. The organic light-emitting diode 14 comprises an anode 141, a light emitting layer 142, and a cathode 143. Both the pixel defining layer 15 and the spacer 16 surround the light emitting layer 142 and the spacer 16 covers the pixel defining layer 15. The pixel defining layer 15 is disposed to delimit an area where the light emitting layer 142 of the organic light-emitting diodes 14 is formed, thereby facilitating formation of the light emitting layer 142 of the organic light-emitting diodes 14 especially when the light emitting layer 142 is formed by inkjet printing. The spacer 16 is disposed to prevent contamination or abnormality of a pattern of the light emitting layer 142 caused by being pressed by the flexible substrate 10 and the mask when the light-emitting layer 142 is deposited by means of evaporation.

In the embodiment, the flexible display panel comprises a plurality of pixel regions 3 arranged in an array. Each pixel region 3 comprises an organic light-emitting diode 14. Each organic light-emitting diode 14 may comprise a separate cathode 143. In other words, each organic light-emitting diode 14 is provided with one cathode 143. In actual applications, referring to FIG. 2, the flexible display panel may be provided with only one cathode 143 covering all of the light emitting layers 142 of the organic light-emitting diodes 14. In this case, the one cathode 143 is shared by all of the organic light-emitting diodes 14.

Referring to FIG. 2, the flexible display panel according to the embodiment of the present disclosure further comprises a packaging layer 17 packaging the organic light-emitting diodes 14. The packaging layer 17 may comprise a plurality of stacked packaging films. Each of the plurality of packaging films may be made of an inorganic material, or an organic material. Alternatively, some of the plurality of packaging films are made of an inorganic material, while the others are made of an organic material. In this case, the packaging films of the inorganic material and the packaging films of the organic material may be stacked alternately to increase a packaging effect of the packaging layer 17 packaging the organic light-emitting diodes 14.

Embodiments of the present disclosure further provide a flexible display apparatus comprising the flexible display panel according to any one of the abovementioned embodiments.

Advantages of the flexible display apparatus are the same as those of the flexible display panel, and are no longer described herein for the sake of brevity.

Figure 3:
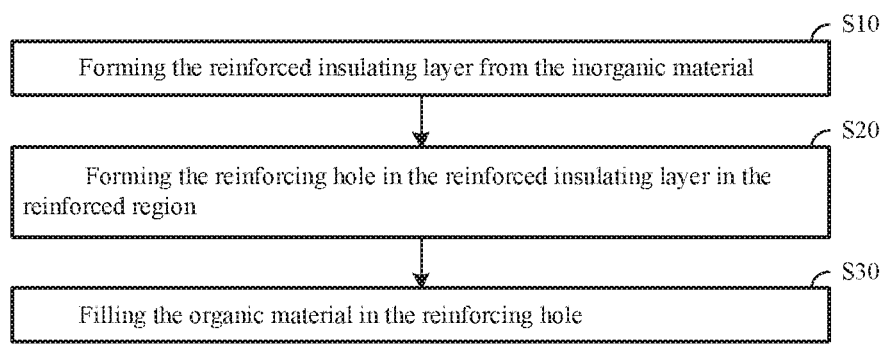
FIG. 3 is a flow diagram of a method of manufacturing a display panel according to an embodiment of the present disclosure.

Referring to FIG. 3, embodiments of the present disclosure further provide a method of manufacturing a flexible display panel such as the flexible display panel according to any one of the abovementioned embodiments. The method comprises: a step S10 of forming the reinforced insulating layer from the inorganic material; a step S20 of forming the reinforcing hole in the reinforced insulating layer in the reinforced region; and a step S30 of filling the organic material in the reinforcing hole.

Advantages of the method are the same as those of the flexible display panel, and are no longer described herein for the sake of brevity.

Referring to FIG. 1, FIG. 2, and FIG. 3, in the embodiment of the present disclosure, the method further comprises: prior to forming the reinforced insulating layer from the inorganic material, forming a first insulating film such that the first insulating film is in contact with the reinforced insulating layer at least in the reinforced region; and/or subsequent to filling the organic material in the reinforcing hole 20, forming a second insulating film such that the second insulating film is in contact with the reinforced insulating layer at least in the reinforced region.

Referring to FIG. 1, FIG. 2, and FIG. 3, in the embodiment of the present disclosure, forming the reinforcing hole 20 in the reinforced insulating layer in the reinforced region comprises: forming, in each pixel display area 4, both the reinforcing hole 20 passing through the gate insulating layer 122 and the reinforcing hole 20 passing through the interlayer insulating layer 124; and filling the organic material in the reinforcing hole 20 comprises: filling the organic material both in the reinforcing hole 20 of the gate insulating layer 122 and in the reinforcing hole 20 of the interlayer insulating layer 124.

Referring to FIG. 1, FIG. 2 and FIG. 3, in embodiments of the present disclosure, the method further comprises: while filling the organic material both in the reinforcing hole 20 of the gate insulating layer 122 and in the reinforcing hole 20 of the interlayer insulating layer 124, forming a planarization layer 13 of the organic material on the interlayer insulating layer 124 such that the planarization layer 13 comprises a planarization portion 131, and a filler portion 132 filled both in the reinforcing hole 20 of the gate insulating layer 122 and in the reinforcing hole 20 of the interlayer insulating layer 124.

Figure 4:
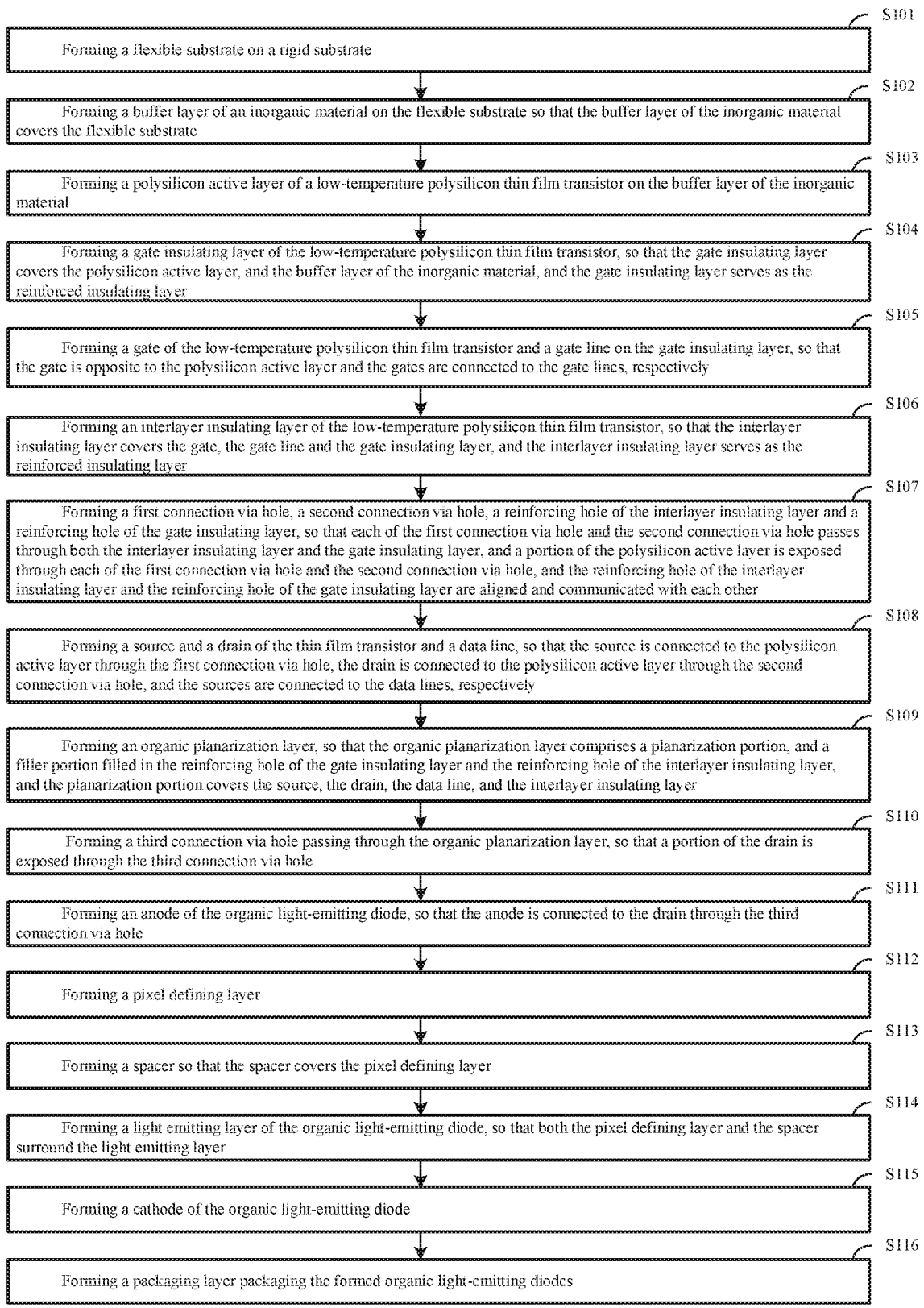
FIG. 4 is a flow diagram of a method of manufacturing a display panel according to another embodiment of the present disclosure.

Specifically, in the case where the flexible display panel comprises: a thin film transistor which is a low-temperature polysilicon thin film transistor and an organic light-emitting diode, referring to FIG. 4, the method may comprise the following steps.

In a step S101, a flexible substrate is formed on a rigid substrate.

In a step S102, a buffer layer of an inorganic material is formed on the flexible substrate. The buffer layer of the inorganic material covers the flexible substrate.

In a step S103, an active layer of a thin film transistor is formed on the buffer layer of the inorganic material.

In a step S104, a gate insulating layer of the thin film transistor is formed. The gate insulating layer covers the active layer, and the buffer layer of the inorganic material. The gate insulating layer serves as the reinforced insulating layer.

In a step S105, a gate of the thin film transistor is formed on the gate insulating layer. The gate is opposite to the active layer. Specifically, while the gate of the thin film transistor is formed, a gate line is formed. The gates are connected to the gate lines, respectively.

In a step S106, an interlayer insulating layer of the thin film transistor is formed. The interlayer insulating layer covers the gate and the gate insulating layer. The interlayer insulating layer serves as the reinforced insulating layer. The interlayer insulating layer also covers the gate lines.

In a step S107, a first connection via hole, a second connection via hole, a reinforcing hole of the interlayer insulating layer and a reinforcing hole of the gate insulating layer are formed. Each of the first connection via hole and the second connection via hole passes through both the interlayer insulating layer and the gate insulating layer, and a portion of the active layer is exposed through each of the first connection via hole and the second connection via hole. The reinforcing hole of the interlayer insulating layer and the reinforcing hole of the gate insulating layer are aligned and communicated with each other.

In a step S108, a source and a drain of the thin film transistor are formed. The source is connected to the active layer through the first connection via hole, while the drain is connected to the active layer through the second connection via hole. While the source and the drain are formed, a data line is formed. The sources are connected to the data lines, respectively.

In a step S109, an organic planarization layer is formed. The organic planarization layer comprises a planarization portion, and a filler portion filled both in the reinforcing hole of the gate insulating layer and in the reinforcing hole of the interlayer insulating layer. The planarization portion covers the source, the drain, and the interlayer insulating layer. The planarization portion also covers the data lines.

In a step S110, a third connection via hole passing through the organic planarization layer is formed. A portion of the drain is exposed through the third connection via hole.

In a step S111, an anode of the organic light-emitting diode is formed on the organic planarization layer. The anode is connected to the drain through the third connection via hole.

In a step S112, a pixel defining layer is formed.

In a step S113, a spacer is formed. The spacer covers the pixel defining layer.

In a step S114, a light emitting layer of the organic light-emitting diode is formed. Both the pixel defining layer and the spacer surround the light emitting layer.

In a step S115, a cathode of the organic light-emitting diode is formed.

In a step S116, a packaging layer packaging the organic light-emitting diodes is formed.

In the description of the above embodiments, specific features, structures, materials or characteristics may be combined in appropriate manners in any one or more embodiments or examples.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A flexible display panel comprising:
   a reinforced insulating layer of an inorganic material, wherein the reinforced insulating layer comprises a reinforced region, and is formed with a reinforcing hole in the reinforced region;
   an organic material filled in the reinforcing hole;
   a first insulating film which is disposed on one side of the reinforced insulating layer, and which is in contact with the reinforced insulating layer at least in the reinforced region; and
   a plurality of pixel regions arranged in an array and each having a pixel display area,
   wherein the entire pixel display area is configured to emit a light of a pixel, and
   wherein the reinforced insulating layer is formed with the reinforcing hole in each pixel display area.

2. The flexible display panel of claim 1, wherein:
   the reinforcing hole is a through hole or a blind hole.

3. The flexible display panel of claim 1, further comprising:
   a second insulating film which is disposed on another side of the reinforced insulating layer opposite to the one side, and which is in contact with the reinforced insulating layer at least in the reinforced region.

4. The flexible display panel of claim 1, further comprising:
   a thin film transistor comprising: a gate, an active layer, and a gate insulating layer between the gate and the active layer,
   wherein the gate insulating layer serves as the reinforced insulating layer, and is formed, in each pixel display area, with the reinforcing hole filled with the organic material.

5. The flexible display panel of claim 4, wherein:
   the thin film transistor further comprises: a source-drain layer, and an interlayer insulating layer between the gate and the source-drain layer, and the interlayer insulating layer serves as the reinforced insulating layer, and is formed, in each pixel display area, with the reinforcing hole filled with the organic material.

6. The flexible display panel of claim 5, wherein:
the reinforcing hole of the gate insulating layer and the reinforcing hole of the interlayer insulating layer are aligned and communicated with each other.

7. The flexible display panel of claim 6, further comprising:
an organic light-emitting diode; and
an organic planarization layer disposed between the thin film transistor and the organic light-emitting diode and comprising a planarization portion and a filler portion filled in the reinforcing hole of the gate insulating layer and the reinforcing hole of the interlayer insulating layer.

8. The flexible display panel of claim 7, wherein:
the organic planarization layer is made of polyimide.

9. The flexible display panel of claim 4, further comprising:
a flexible substrate; and
a buffer layer of an inorganic material between the flexible substrate and the thin film transistor.

10. The flexible display panel of claim 1, wherein:
the reinforcing hole is a tapered hole.

11. A flexible display apparatus comprising:
the flexible display panel of claim 1.

12. A method of manufacturing the flexible display panel of claim 1, comprising:
forming the reinforced insulating layer from the inorganic material;
forming the reinforcing hole in the reinforced insulating layer in the reinforced region; and
filling the organic material in the reinforcing hole.

13. The method of claim 12, further comprising:
prior to forming the reinforced insulating layer from the inorganic material, forming a first insulating film such that the first insulating film is in contact with the reinforced insulating layer at least in the reinforced region; and/or
subsequent to filling the organic material in the reinforcing hole, forming a second insulating film such that the second insulating film is in contact with the reinforced insulating layer at least in the reinforced region.

14. The method of claim 12, wherein:
the flexible display panel further comprises:
a thin film transistor comprising: a gate, a gate insulating layer, a source-drain layer, and an interlayer insulating layer located between the gate and the source-drain layer and overlapping the gate insulating layer in each pixel display area,
forming the reinforcing hole in the reinforced insulating layer in the reinforced region comprises: forming, in each pixel display area, both the reinforcing hole passing through the gate insulating layer and the reinforcing hole passing through the interlayer insulating layer; and
filling the organic material in the reinforcing hole comprises: filling the organic material in both the reinforcing hole of the gate insulating layer and the reinforcing hole of the interlayer insulating layer.

15. The method of claim 14, further comprising:
while filling the organic material in the reinforcing hole of the gate insulating layer and the reinforcing hole of the interlayer insulating layer, forming a planarization layer of the organic material on the interlayer insulating layer such that the planarization layer comprises a planarization portion and a filler portion filled in both the reinforcing hole of the gate insulating layer and the reinforcing hole of the interlayer insulating layer.

16. A flexible display panel comprising:
a reinforced insulating layer of an inorganic material, wherein the reinforced insulating layer comprises a reinforced region, and is formed with a reinforcing hole in the reinforced region;
an organic material filled in the reinforcing hole;
a first insulating film which is disposed on one side of the reinforced insulating layer, and which is in contact with the reinforced insulating layer at least in the reinforced region; and
organic light-emitting diodes arranged in an array and each comprising a light emitting layer,
wherein orthogonal projections of the reinforcing holes of the reinforced insulating layer on a plane parallel to the flexible display panel are positioned within orthogonal projections of the light emitting layers of the organic light-emitting diodes on the plane, respectively.

17. The flexible display panel of claim 16, further comprising:
a second insulating film which is disposed on another side of the reinforced insulating layer opposite to the one side, and which is in contact with the reinforced insulating layer at least in the reinforced region.

* * * * *